United States Patent
Han (10) Patent No.: US 8,922,000 B2
(45) Date of Patent: Dec. 30, 2014

(54) CHIP CARRIERS, SEMICONDUCTOR DEVICES INCLUDING THE SAME, SEMICONDUCTOR PACKAGES INCLUDING THE SAME, AND METHODS OF FABRICATING THE SAME

(75) Inventor: Kwon Whan Han, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 79 days.

(21) Appl. No.: 13/570,444

(22) Filed: Aug. 9, 2012

(65) Prior Publication Data
US 2013/0099368 A1    Apr. 25, 2013

(30) Foreign Application Priority Data
Oct. 19, 2011    (KR) .................. 10-2011-0107106

(51) Int. Cl.
*H01L 23/34* (2006.01)
*H01L 25/065* (2006.01)
*H01L 23/13* (2006.01)
*H01L 23/14* (2006.01)
*H01L 23/36* (2006.01)
*H01L 23/42* (2006.01)
*H01L 23/473* (2006.01)
*H01L 23/498* (2006.01)
*H01L 25/03* (2006.01)
*H01L 25/18* (2006.01)
*H01L 23/00* (2006.01)

(52) U.S. Cl.
CPC ............ *H01L 25/0657* (2013.01); *H01L 23/13* (2013.01); *H01L 23/147* (2013.01); *H01L 23/36* (2013.01); *H01L 23/42* (2013.01); *H01L 23/473* (2013.01); *H01L 23/49827* (2013.01); *H01L 25/03* (2013.01); *H01L 25/18* (2013.01); *H01L 2225/06517* (2013.01); *H01L 2225/06582* (2013.01); *H01L 2225/06589* (2013.01); *H01L 2225/06513* (2013.01); *H01L 2225/06541* (2013.01); *H01L 2225/06565* (2013.01); *H01L 2225/06548* (2013.01); *H01L 24/16* (2013.01); *H01L 2224/13025* (2013.01); *H01L 2224/131* (2013.01); *H01L 2224/16146* (2013.01); *H01L 2224/32145* (2013.01); *H01L 2224/32225* (2013.01); *H01L 2224/73204* (2013.01); *H01L 2924/10253* (2013.01)
USPC ............................ 257/713; 257/692; 257/712

(58) Field of Classification Search
CPC ....... H01L 23/13; H01L 23/147; H01L 23/36; H01L 23/367; H01L 23/3675
USPC .......................................... 257/692, 712, 713
See application file for complete search history.

(56) References Cited

U.S. PATENT DOCUMENTS 7,601,600 B2    10/2009    Ko et al.
2010/0237483 A1*    9/2010    Chi et al. .................. 257/686
(Continued)

FOREIGN PATENT DOCUMENTS

KR    1020090069825 A    1/2009
KR    1020090078194 A    7/2009
(Continued)

*Primary Examiner* — Daniel Whalen
(74) *Attorney, Agent, or Firm* — William Park & Associates Patent Ltd.

(57) ABSTRACT

Chip carriers are provided. The chip carrier includes a carrier body having a cavity therein and at least one conductive through silicon via (TSV) penetrating the carrier body under the cavity. The cavity includes an uneven sidewall surface profile. The at least one conductive through silicon via (TSV) is exposed at a bottom surface of the carrier body opposite to the cavity. Related methods are also provided.

19 Claims, 10 Drawing Sheets

(56) References Cited

U.S. PATENT DOCUMENTS

| | | | |
|---|---|---|---|
| 2011/0207323 A1* | 8/2011 | Ditizio | 438/675 |
| 2012/0193779 A1* | 8/2012 | Lee et al. | 257/737 |
| 2012/0228754 A1* | 9/2012 | Liu et al. | 257/676 |

FOREIGN PATENT DOCUMENTS

| | | |
|---|---|---|
| KR | 1020090081499 A | 7/2009 |
| KR | 1020110088003 A | 8/2011 |

* cited by examiner

CHIP CARRIERS, SEMICONDUCTOR DEVICES INCLUDING THE SAME, SEMICONDUCTOR PACKAGES INCLUDING THE SAME, AND METHODS OF FABRICATING THE SAME

CROSS-REFERENCES TO RELATED APPLICATIONS

The present application claims priority under 35 U.S.C 119(a) to Korean Application No. 10-2011-0107106, filed on Oct. 19, 2011, in the Korean intellectual property Office, which is incorporated herein by reference in its entirety as set forth in full.

BACKGROUND

1. Field of the Invention

Example embodiments of the present disclosure relate to semiconductor packages and methods of fabricating the same and, more particularly, to chip carriers, semiconductor devices including the same, semiconductor packages including the same, and methods of fabricating the same.

2. Description of the Related Art

Recently, multi-chip stacked packages have become desirable in the electronics industry because high performance electric or electronic products with lighter, smaller and faster sophisticated electronic components are needed for sophisticated electronic systems. Accordingly, various technologies for stacking a plurality of semiconductor chips have been developed. The multi-chip stacked packages may allow the electric or electronic products to have a relatively larger memory capacity. Further, the multi-chip stacked packages may improve a packaging density or a packaging efficiency in a limited area.

Through silicon vias (TSVs) have been widely used as electrical connectors between the stacked chips. TSVs may penetrate the chips and may act as electrodes. Thus, when the TSVs are formed to act as the electrodes or the electrical connectors in the package processes, conventional bonding wires may not be required. Hence, when the TSVs are employed in the packages, various advantages can be obtained.

In addition to the multi-chip stack technologies and the TSV technologies, system-in-package technologies have been widely used in the package processes. According to the system-in-packages, two or more different kinds of chips may be mounted on a single substrate. According to an example of the system-in-packages, a logic chip may be mounted on a substrate and a memory chip may be stacked on a side of the logic chip that is opposite to the substrate. If different kinds of chips are vertically stacked on a substrate as described above, interposers may be disposed between the stacked chips as well as between a lowermost chip and the substrate to adjust contact pitches of the stacked chips. For example, a logic chip, an interposer and a memory chip may be sequentially stacked on the substrate.

When a planar area of the logic chip is greater than that of the memory chip, a thermal conductive media should be disposed around the memory chip to transfer heat from the logic chip toward an outside region, or the size of the stacked memory chip should be increased to have a similar size to that of the logic chip in order to provide a thermal conductive path. In addition, it may be necessary to cover the logic chip and the memory chip with a metallic heat spreader to increase the heat emission efficiency. However, if the metallic heat spreader is employed, the metallic heat spreader may cause a physical stress applied to the semiconductor chips (e.g., the logic chip and the memory chip). Further, an empty space may be provided between the stacked memory chip and the metallic heat spreader. The empty space may have a relatively poor thermal conductivity, thereby degrading the reliability of the system-in-packages.

SUMMARY

Example embodiments are directed to chip carriers that are appropriate to efficiently emit heat from stacked memory chips and methods of fabricating the same.

Further, embodiments are directed to semiconductor devices including chip carriers and methods of fabricating the same.

Moreover, embodiments are directed to semiconductor packages including chip carriers and methods of fabricating the same.

According to some embodiments, a chip carrier includes a carrier body having a cavity therein and at least one conductive through silicon via (TSV) penetrating the carrier body under the cavity. The cavity includes an uneven sidewall surface profile. The at least one conductive through silicon via (TSV) is exposed at a bottom surface of the carrier body opposite to the cavity.

According to another embodiment, a semiconductor device includes a chip carrier and a semiconductor chip module. The chip carrier includes a carrier body having a cavity therein and at least one conductive through silicon via (TSV) penetrating the carrier body under the cavity. The semiconductor chip module is disposed in the cavity. The cavity includes an uneven sidewall surface profile. The at least one conductive through silicon via (TSV) is exposed at a bottom surface of the carrier body that is opposite to the cavity.

According to some other embodiments, a semiconductor package includes, a chip carrier including a semiconductor chip module disposed in the chip carrier. The chip carrier includes a carrier body having a cavity therein and at least one conductive through silicon via (TSV) penetrating the carrier body under the cavity. The semiconductor chip module is disposed in the cavity. The cavity includes an uneven sidewall surface profile. The at least one conductive through silicon via (TSV) is exposed at a bottom surface of the carrier body that is opposite to the cavity.

According to some other embodiments, a semiconductor package includes a substrate, a first semiconductor chip module disposed on the substrate, a chip carrier disposed on a side of the first semiconductor chip module opposite to the substrate, and a second semiconductor chip module disposed in the chip carrier. The chip carrier includes a carrier body having a cavity therein and at least one conductive through silicon via (TSV) penetrating the carrier body under the cavity. The second semiconductor chip module is disposed in the cavity. The cavity includes an uneven sidewall surface profile. The at least one conductive through silicon via (TSV) is exposed at a bottom surface of the carrier body that is opposite to the cavity.

According to some other embodiments, a semiconductor package includes a substrate, a first semiconductor chip module disposed on a first region of the substrate, a chip carrier disposed on a second region of the substrate, and a second semiconductor chip module disposed in the chip carrier. The chip carrier includes a carrier body having a cavity therein and at least one conductive through silicon via (TSV) penetrating the carrier body under the cavity. The second semiconductor chip module is disposed in the cavity. The cavity includes an uneven sidewall surface profile. The at least one conductive through silicon via (TSV) is exposed at a bottom surface of the carrier body that is opposite to the cavity.

According to some other embodiments, a method of fabricating a chip carrier includes forming through silicon vias (TSVs) that extend from a bottom surface of a carrier body layer into the carrier body layer by a predetermined depth, and etching a portion of a top surface of the carrier body layer to form a carrier body having a cavity therein. Sidewalls of the cavity are formed to have an uneven vertical surface profile, and the through silicon vias (TSVs) are exposed at the bottom surface of the carrier body.

According to some other embodiments, a method of fabricating a semiconductor device includes providing a chip carrier that has a carrier body having a cavity therein and conductive through silicon vias (TSVs) penetrating the carrier body under the cavity, and mounting a semiconductor chip module in the cavity. The cavity is formed to have an uneven sidewall surface profile. The conductive through silicon vias (TSVs) are exposed at a bottom surface of the carrier body that is opposite to the cavity.

According to some other embodiments, a method of fabricating a semiconductor package includes providing a chip carrier that has a carrier body having a cavity therein and conductive through silicon vias (TSVs) penetrating the carrier body under the cavity, disposing a semiconductor chip module in the cavity, and mounting the chip carrier on a substrate after the semiconductor chip module is disposed in the cavity. The cavity is formed to have an uneven sidewall surface profile. The conductive through silicon vias (TSVs) are exposed at a bottom surface of the carrier body that is opposite to the cavity.

According to some other embodiments, a method of fabricating a semiconductor package includes mounting a first semiconductor chip module on a substrate, providing a chip carrier that includes a carrier body having a cavity therein and conductive through silicon vias (TSVs) penetrating the carrier body under the cavity, mounting a second semiconductor chip module in the cavity, and mounting the chip carrier on a side the first semiconductor chip module opposite to the substrate after the second semiconductor chip module is mounted in the cavity. The cavity is formed to include an uneven sidewall surface profile. The conductive through silicon vias (TSVs) are exposed at a bottom surface of the carrier body opposite to the cavity.

According to some other embodiments, a method of fabricating a semiconductor package includes mounting a first semiconductor chip module on a first region of a substrate, preparing a chip carrier that includes a carrier body having a cavity therein and conductive through silicon vias (TSVs) penetrating the carrier body under the cavity, mounting a second semiconductor chip module disposed in the cavity, and mounting the chip carrier on a second region of the substrate after the second semiconductor chip module is mounted in the cavity. The cavity is formed to include an uneven sidewall surface profile. The conductive through silicon vias (TSVs) are exposed at a bottom surface of the carrier body that is opposite to the cavity.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF THE EMBODIMENTS

Example embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough, and will convey a scope of the disclosure to those skilled in the art. In the drawings, the sizes and relative sizes of layers and regions may be exaggerated for clarity. The same reference numerals or the same reference designators denote the same elements throughout the specification.

Example embodiments are described herein with reference to cross-section illustrations that are schematic illustrations of example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present.

In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
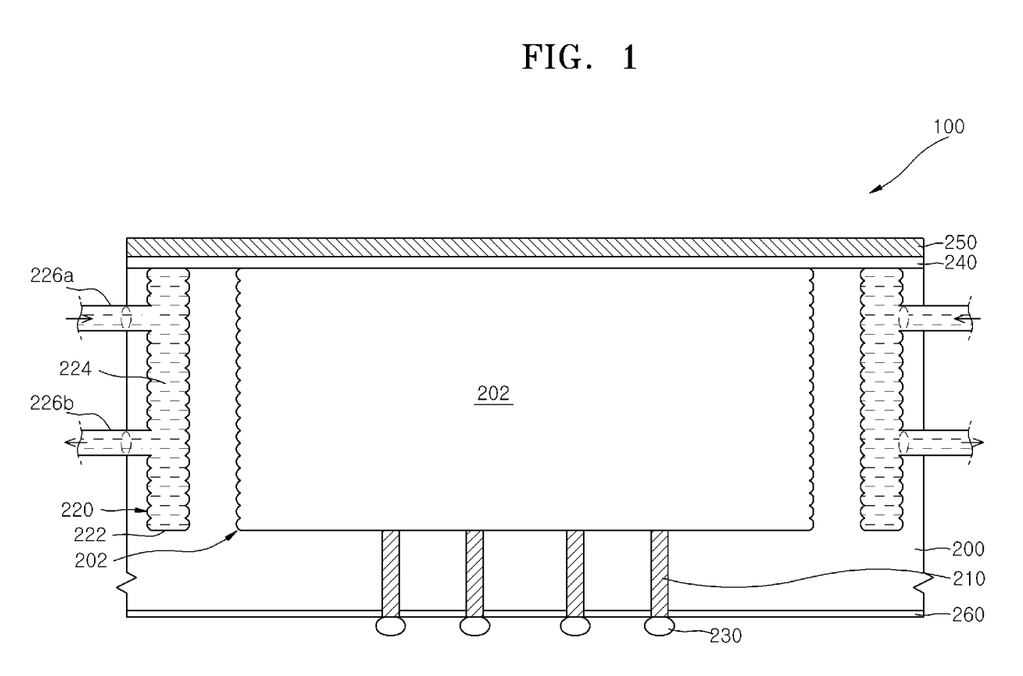
FIG. 1 is a cross sectional view illustrating a chip carrier according to an embodiment.

FIG. 1 is a cross sectional view illustrating a chip carrier according to an embodiment. Referring to FIG. 1, a chip carrier 100 according to an embodiment may include a carrier body 200 having a cavity 202 therein and at least one conductive through silicon via (TSVs) 210 penetrating the carrier body 200 under the cavity 202. An upper portion of the cavity 202 may be open, and inner sidewall surfaces of the cavity 202 may have uneven surface profiles, for example, scallop profiles. This chip carrier 100 may be used as an interposer for stacking a plurality of chips.

The carrier body 200 may define the cavity 202 and may include at least one heat sink 220 disposed in the sidewalls of the carrier body 200. The cavity 202 may correspond to an empty space having a predetermined depth from a top surface of the carrier body 200. Each of the inner sidewall surfaces defining the cavity 202 may have an uneven profile, for example, a wave shape or a scallop shape, as described above. Thus, the sidewall surfaces of the cavity 202 may have a relatively increased surface area as compared with a cavity defined by vertical and flat sidewall surfaces. Accordingly, a heat emission efficiency of the chip carrier 100 can be improved because of the presence of the scallop-shaped sidewall surfaces of the cavity 202. The cavity 202 may provide a space in which semiconductor chips are mounted. Thus, a size of the cavity 202 may be determined according to sizes of the semiconductor chips that are to be carried. In an embodiment, the carrier body 200 may include a silicon material that, in one example, comprises a silicon wafer. However, the inventive concepts are not limited thereto. If the carrier body 200 is formed of a silicon material and a silicon substrate or a silicon chip is disposed under the carrier body 200, a coefficient of thermal expansion (CTE) of the carrier body 200 may be equal to that of the silicon substrate or the silicon chip. That is, the carrier body 200 and the substrate (or the chip) under the carrier body 200 may include the same material, thereby preventing or alleviating a mechanical stress and/or a physical stress that is generated due to a difference between the CTE of the carrier body 200 and the CTE of the CTE of substrate (or the chip) under the carrier body 200.

The through silicon vias (TSVs) 210 may be disposed to penetrate the carrier body 200, as described above. Thus, first ends of the through silicon vias (TSVs) 210 may be exposed at a bottom surface of the cavity 202, and second ends of the through silicon vias (TSVs) 210 may be exposed at a bottom surface of the carrier body 200 that is on an opposite side of the bottom surface as the bottom surface of the cavity 202, that is, the second ends of the through silicon vias (TSVs) 210 may be opposite to the cavity 202. Accordingly, the through silicon vias (TSVs) 210 may act as electrical signal paths between the semiconductor chips mounted in the cavity 202 and another semiconductor chip or a substrate disposed under the carrier body 200. The through silicon vias (TSVs) 210 may be formed of a conductive material, for example, a metal material. Thus, the through silicon vias (TSVs) 210 may be electrically insulated from the carrier body 200 by a thin insulation layer (not shown) disposed between the carrier body 200 and the through silicon vias (TSVs) 210.

A lid 240 may be disposed on the carrier body 200 to cover and seal the cavity 202. In an embodiment, the lid 240 may include the same material as the carrier body 200. For example, the carrier body 200 and the lid 240 may include a silicon material, thereby suppressing generation of a mechanical stress and/or a physical stress between the carrier body 200 and the lid 240. Moreover, a heat radiation plate 250 may be additionally disposed on the lid 240. In particular, the heat radiation plate 250 may be disposed on a side of the lid 240 that is opposite to the carrier body 200. The heat radiation plate 250 may include a metallic material. Alternatively, if a high heat emission efficiency of the chip carrier 100 is required, the lid 240 may include a metallic material.

The heat sink 220 in the sidewalls of the carrier body 200 may be configured to include a heat sink hole 222 having an uneven sidewall profile (e.g., a scallop-shaped profile) and a coolant 224 filling the heat sink hole 222. Since the sidewalls of the heat sink hole 222 have a scallop-shaped profile like the sidewalls of the cavity 202, a contact area between the coolant 224 and the carrier body 200 may be increased. Thus, heat of the carrier body 200 may be more readily emitted toward an outside region of the carrier body 200 through the coolant 224 of the heat sink 220. The heat sink hole 222 may be disposed to be spaced apart from the sidewall surfaces of the cavity 202, and the heat sink hole 222 may have a predetermined depth from a top surface of sidewalls of the carrier body 200. The depth of the heat sink hole 222 may be substantially equal to that of the cavity 202. Alternatively, the depth of the heat sink hole 222 may be less or greater than that of the cavity 202. Even though FIG. 1 shows a pair of separate heat sink holes 222 that are disposed in respective ones of both sidewalls of the carrier body 200, the pair of heat sink holes 222 may be spatially connected to each other. That is, a single heat sink hole 222 may be disposed to substantially surround whole sidewalls of the cavity 202. In this case, the depth of the heat sink hole 222 may be substantially equal to or greater than that of the cavity 202. In some embodiments, the single heat sink hole 222 may be disposed to surround only a portion of each of the sidewalls of the cavity 202. In this case, the depth of the heat sink hole 222 may be substantially less than that of the cavity 202.

The heat sink 220 may further include a first conduit line 226a and a second conduit line 226b. A first end of the first conduit line 226a may be connected to a portion of the heat sink hole 222 and a second end of the first conduit line 226a may be connected to a coolant reservoir (not shown). Similarly, a first end of the second conduit line 226b may be connected to another portion of the heat sink hole 222 and a second end of the second conduit line 226b may be connected to the coolant reservoir (not shown). That is, the first and second conduit lines 226a and 226b may extend from the heat sink hole 222 to pass through the outer sidewall of the heat sink hole 222 and may reach and connect to the coolant reservoir. The coolant 224 in the coolant reservoir may be introduced into the heat sink hole 222 through the first conduit line 226a, and the coolant 224 in the heat sink hole 222 may be vented into the coolant reservoir through the second conduit line 226b. That is, the coolant 224 in the heat sink hole 222 may circulate through the first and second conduit lines 226a and 226b, thereby maximizing a cooling effect of the chip carrier 100.

A protection pattern 260 may be disposed on the bottom surface of the carrier body 200 that is opposite to the surface of the carrier body 200 where the lid 240 is disposed. The through silicon vias (TSVs) 210 may penetrate the protection pattern 260 such that the second ends (e.g., lower ends) of the through silicon vias (TSVs) 210 are exposed at a bottom surface of the protection pattern 260. At least one electrode, for example, bumps 230 may be disposed on respective ones of the exposed lower ends of the through silicon vias (TSVs) 210. In some embodiments, the electrodes may be pillar bump electrodes, solder bump electrodes or electrode pads. For example, electrode pads instead of the bumps 230 may be disposed on the bottom surface of the protection pattern 260 opposite to a side of the protection pattern 260 on which the carrier body 200 is disposed. When the electrode pads are disposed on the protection pattern 260 opposite to the carrier body 200, the electrode pads may be randomly disposed on the protection pattern 260 and may be electrically connected to the lower ends of the through silicon vias (TSVs) 210 through redistribution lines (not shown). Although not shown in the drawings, an under bump metal (UBM) layer may be disposed between each of the through silicon vias (TSVs) 210 and the corresponding one of the bumps 230 when the bumps 230 are disposed on respective ones of the lower ends of the through silicon vias (TSVs) 210.

Figure 2:
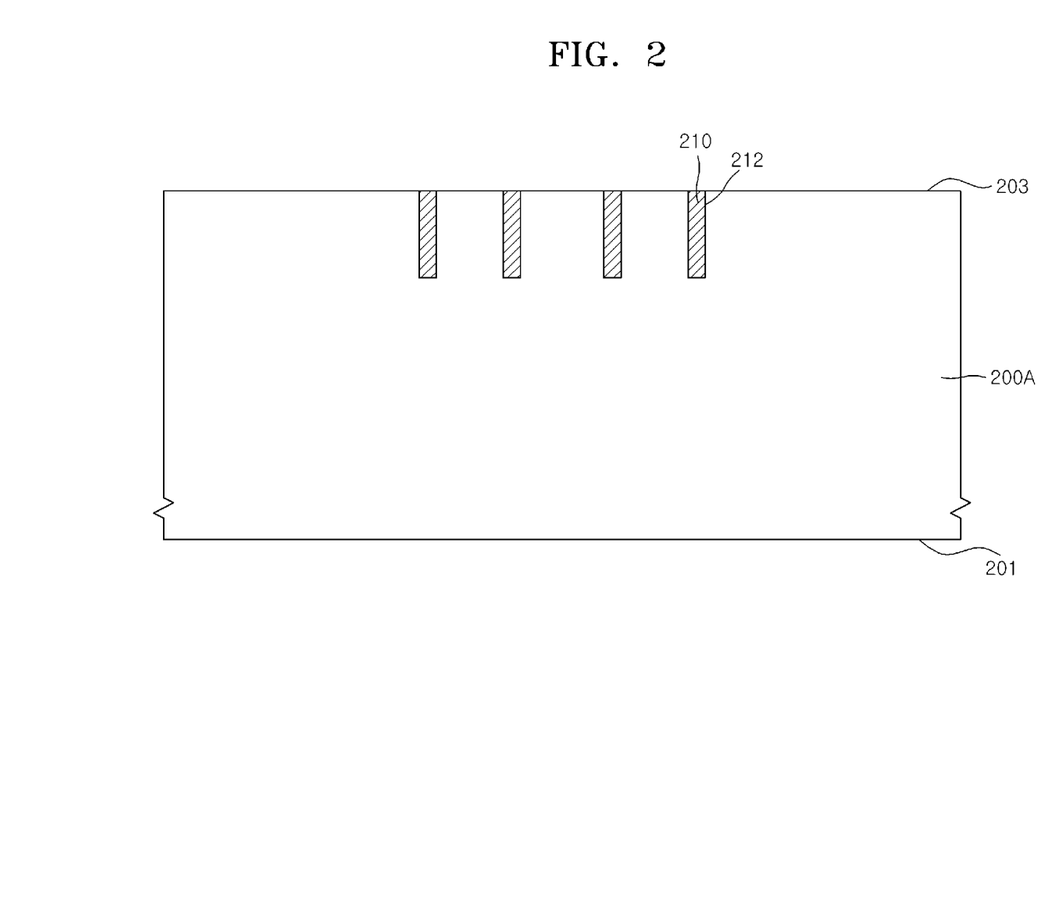
FIGS. 2 and 3 are cross sectional views illustrating a method of fabricating a chip carrier according to an embodiment.
Figure 3:
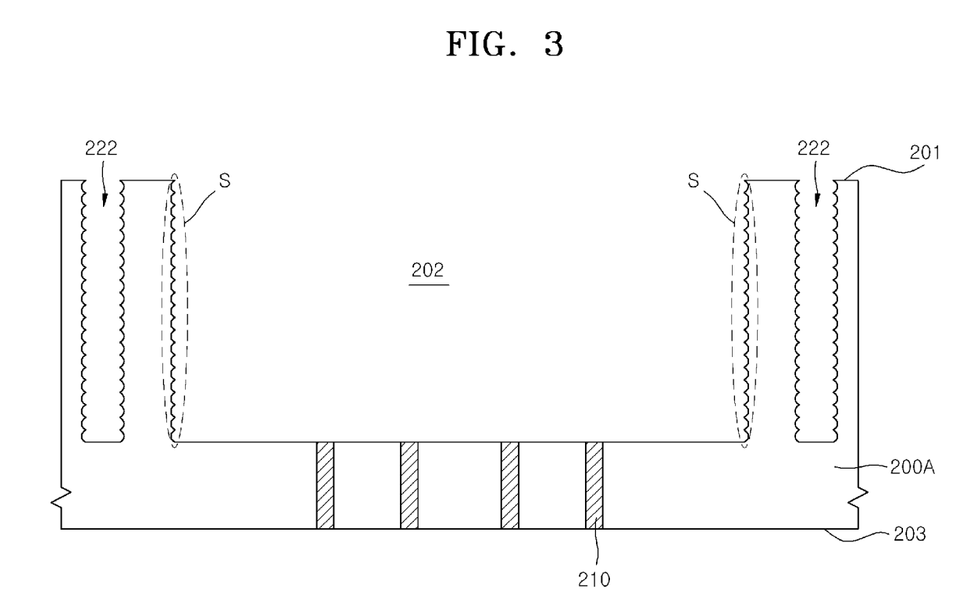

FIGS. 2 and 3 are cross sectional views illustrating a method of fabricating a chip carrier according to an embodiment. Referring to FIG. 2, a carrier body layer 200A may be provided. The carrier body layer 200A may be comprised of a silicon material. For example, the carrier body layer 200A may be a silicon substrate. The carrier body layer 200A may have a top surface 201 and a bottom surface 203. Subsequently, the carrier body layer 200A may be flipped to be upside-down. As a result, the bottom surface 203 of the carrier body layer 200A may be located at a higher level than the top surface 201 of the carrier body layer 200A, as illustrated in FIG. 2. An etching process may be applied to the bottom surface of the carrier body layer 200A, thereby forming through via holes 212 having a predetermined depth from the bottom surface of the carrier body layer 200A. Through silicon vias (TSVs) 210 may be formed in respective ones of the through via holes 212. The through silicon vias (TSVs) 210 may be formed of a metal layer filling the through via holes 212. Although not shown in the drawings, an insulation layer may be formed on inner sidewalls of the through via holes 212 prior to formation of the through silicon vias (TSVs) 210. Accordingly, the through silicon vias (TSVs) 210 may be electrically insulated from the carrier body layer 200A by the insulation layer. The through silicon vias (TSVs) 210 may be formed by depositing a metal layer in the through via holes 212 and on the bottom surface 203 of the carrier body layer 200A and by planarizing the metal layer until the bottom surface 203 of the carrier body layer 200A is exposed. Alternatively, the through silicon vias (TSVs) 210 may be formed using an electro plating process. That is, a metallic seed layer may be formed on inner surfaces of the through via holes 212, and a metal layer may be formed on the metallic seed layer using an electro plating process to fill the through via holes 212. As a result, the metallic TSVs 210 may be formed to fill the through via holes 212. Even though the TSVs 210 are formed using an electro plating process, the electro plating process may be followed by a planarization process.

Referring to FIG. 3, the carrier body layer 200A including the through silicon vias (TSVs) 210 may be flipped such that the top surface 201 is located at a higher level than the bottom surface 203. An etching process may be then applied to the top surface 201 of the carrier body layer 200A, thereby forming a cavity 202 and a heat sink hole 222 having a predetermined depth from the top surface 201 of the carrier body layer 200A. The heat sink hole 222 may be formed to surround the cavity 202 and may be spaced apart from the cavity 202. As a result of forming the cavity 202 and the heat sink hole 222, a carrier body 200 may be completely formed. Although not shown in the drawings, a mask pattern may be formed on the top surface 201 before the etching process for forming the carrier body layer 200A is performed. The mask pattern may have openings that define the cavity 202 and the heat sink hole 222. In an embodiment, the mask pattern may be formed of a silicon nitride layer. Subsequently, the carrier body layer 200A may be etched using the mask pattern as an etch mask, thereby forming the cavity 202 and the heat sink hole 222. The etching process for forming the cavity 202 and the heat sink hole 222 may be performed until the through silicon vias 210 under the cavity 202 are exposed.

The etching process for forming the cavity 202 and the heat sink hole 222 may be performed using a dry etching process, for example, a reactive ion etching (RIE) technique. In particular, the etching process for forming the cavity 202 and the heat sink hole 222 may be performed such that each of the cavity 202 and the heat sink hole 222 has an uneven sidewall surface profile, for example, a scallop-shaped profile S such as a wave-shaped profile. The scallop-shaped profile S may include a plurality of horizontally recessed regions which are vertically stacked. The scallop-shaped profiles S can be formed by periodically changing an etch recipe or an etch condition of the etching process while the cavity 202 and the heat sink hole 222 are formed. In formation of the scallop-shaped profile S, a horizontal depth of each of the recessed regions may be controlled by the etch recipe of the etching process for forming the cavity 202 and the heat sink hole 222. If a decrease of the horizontal depths of the recessed regions is required to obtain a smooth vertical profile of the sidewalls of the cavity 202 and the heat sink hole 222, the etching process may be performed using a Bosch process. According to the Bosch process, an etching step and a polymer deposition step may be alternately and repeatedly performed. According to the present embodiment described above, the cavity 202 may be formed after formation of the through silicon vias 210. However, the inventive concepts are not limited thereto. For example, after the cavity 202 is formed, the through via holes 212 may be formed to penetrate the carrier body 200 under the cavity 202.

Subsequently, as illustrated in FIG. 1, the heat sink hole 222 may be filled with the coolant 224, and the lid 240 and the heat radiation plate 250 may be sequentially formed on carrier body 200 to cover cavity 202. In some embodiments, the lid 240 may be formed of the same material as the carrier body 200. For example, when the carrier body 200 is formed of a silicon material, the lid 240 may also be formed of a silicon material. As a result, generation of a mechanical stress and/or a physical stress between the carrier body 200 and the lid 240 may be suppressed because a coefficient of thermal expansion (CTE) of the lid 240 is substantially equal to that of the carrier body 200. The heat radiation plate 250 may be formed of a metallic material. Alternatively, if a high heat emission efficiency of the chip carrier 100 is required, the lid 240 may be formed of a metallic material. Bumps 230 may be then formed on respective ones of bottom surfaces of the through silicon vias 210. That is, the bumps 230 may be electrically connected to respective ones of the through silicon vias 210. The bumps 230 may be formed prior to formation of the lid 240 and the heat radiation plate 250. The first conduit line 226a and the second conduit line 226b may be formed to penetrate an outer sidewall of the heat sink hole 222. The first and second conduit lines 226a and 226b may connect the heat sink hole 222 to a coolant reservoir located at outside region of the carrier body 200. The coolant in the coolant reservoir may be supplied into the heat sink hole 222 through the first conduit line 226a and the coolant in the heat sink hole 222 may be vented out through the second conduit line 226b. That is, the coolant in the coolant reservoir may circulate through the first and second conduit lines 226a and 226b. In some other embodiments, the first and second conduit lines 226a and 226b may be formed while the cavity 202 is formed. In further embodiments, the protection pattern 260 may be formed on the bottom surface 203 of the carrier body layer 200A prior to formation of the through silicon vias 210. In this case, the through silicon vias 210 may be formed to penetrate the protection pattern 260.

Figure 4:
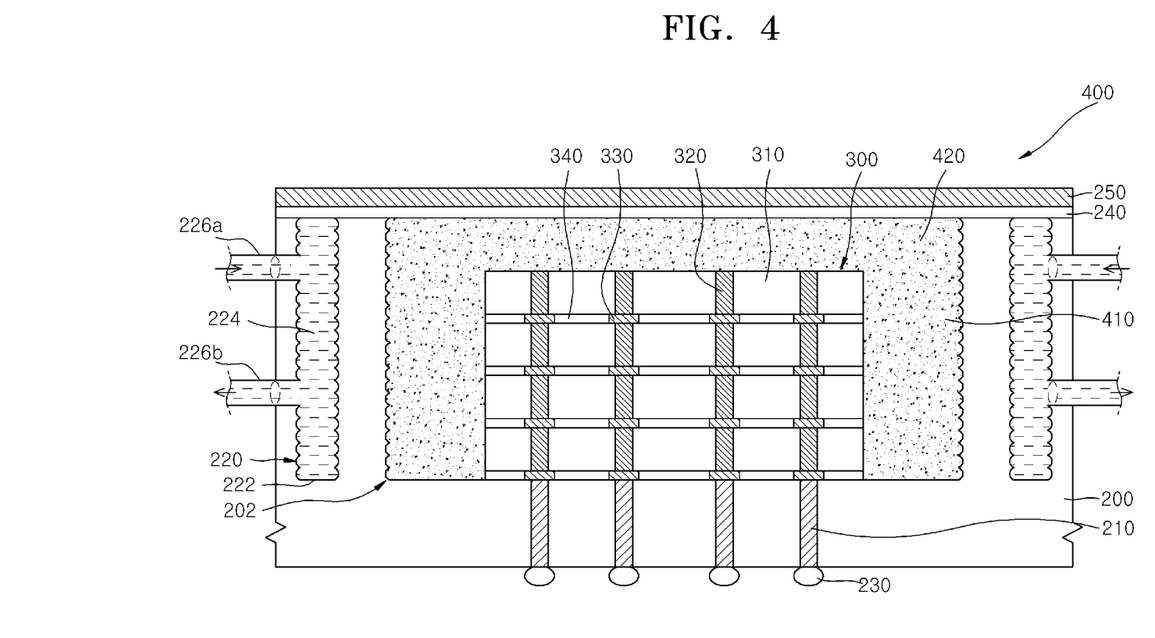
FIG. 4 is a cross sectional view illustrating a semiconductor device including a chip carrier according to an embodiment.

FIG. 4 is a cross sectional view illustrating a semiconductor device including a chip carrier according to an embodiment. Referring to FIG. 4, a semiconductor device 400 may be configured to include a chip carrier and a semiconductor chip module 300 mounted in a cavity 202 of the chip carrier. The chip carrier of the semiconductor device 400 may have the same or similar structure as the chip carrier 100 described with reference to FIG. 1. Thus, to avoid duplicate explanation, descriptions to the chip carrier of the semiconductor device 400 may be omitted or briefly mentioned in the present embodiment. The semiconductor chip module 300 in the cavity 202 of the chip carrier may include a plurality of semiconductor chips 310 which are vertically stacked, and each of the semiconductor chips 310 may include through silicon vias (TSVs) 320 vertically penetrating a body thereof and bumps 330 disposed on a bottom surface of the body. In each semiconductor chip 310, the through silicon vias (TSVs) 320 may be electrically connected to respective ones of the bumps 330. Thus, the through silicon vias (TSVs) 320 of the upper and lower semiconductor chips 310 may be electrically connected to each other by the bumps 330 between the upper and lower semiconductor chips 310. The through silicon vias (TSVs) 320 of the lowermost semiconductor chip 310 among the plurality of semiconductor chips 310 may be electrically connected to the TSVs 210 penetrating the carrier body 200 under the cavity 202 through the bumps 330 between the lowermost semiconductor chip 310 and the carrier body 200. Further, at least one electrode, for example the bumps 230, may be disposed on a bottom surface of the carrier body 200 that is opposite to the semiconductor chip module 300. An adhesive agent 340 for under fill may be disposed between the semiconductor chips 310 which are vertically stacked.

A width of the semiconductor chip module 300 may be less than a width of the cavity 202. Thus, sidewalls of the semiconductor chip module 300 may be spaced apart from respective ones of sidewalls of the cavity 202. That is, an empty space may be provided between the sidewalls of the semiconductor chip module 300 and the sidewalls of cavity 202. The empty space between the sidewalls of the semiconductor chip module 300 and the sidewalls of the cavity 202 may be filled with a side thermal interface material (TIM) layer 410. Further, a height of the semiconductor chip module 300 may be less than a depth of the cavity 202. Thus, an empty space may also be provided between a top surface of the semiconductor chip module 300 and a bottom surface of the lid 240. The empty space between the semiconductor chip module 300 and the lid 240 may be filled with an upper thermal interface material (TIM) layer 420. That is, the empty space on the sidewalls of the semiconductor chip module 300 may be filled with the side thermal interface material (TIM) layer 410, and the empty space on the top surface of the semiconductor chip module 300 may be filled with the upper thermal interface material (TIM) layer 420. The side thermal interface material (TIM) layer 410 and the upper thermal interface material (TIM) layer 420 may include a high thermal conductive material, for example, a polymer material or a metallic material. If the side thermal interface material (TIM) layer 410 includes a metallic material, a thin insulation layer (not shown) may be disposed between the semiconductor chip module 300 and the side thermal interface material (TIM) layer 410. Similarly, if the upper thermal interface material (TIM) layer 420 includes a metallic material, a thin insulation layer (not shown) may also be disposed between the semiconductor chip module 300 and the upper thermal interface material (TIM) layer 420.

In the semiconductor device 400 according to the present embodiment, electrical signal may be transmitted between the semiconductor chip module 300 and an external device through the TSVs 210 which penetrate the carrier body 200. In addition, heat generated from the semiconductor chip module 300 may be laterally radiated into an outside region through the side TIM layer 410, the carrier body 200 and the heat sink 220. Further, heat generated from the semiconductor chip module 300 may be vertically radiated into the outside region of the carrier body 200 through the upper TIM layer 420, the lid 240 and the heat radiation plate 250. According to the present embodiment described above, the empty space surrounding the semiconductor chip module 300 in the cavity 202 may be completely filled with the side TIM layer 410 and the upper TIM layer 420. Thus, no empty space may exist around the semiconductor chip module 300 in the cavity 202. If the empty space filled with air exists around the semiconductor chip module 300 in the cavity 202, a heat emission efficiency of the chip carrier may be degraded because a thermal conductivity of the air in the empty space is lower than that of the side and upper TIM layers 410 and 420. Hence, the chip carrier according to embodiments may exhibit an excellent heat emission efficiency since the empty space around the semiconductor chip module 300 in the cavity 202 is completely filled with the side TIM layer 410 and the upper TIM layer 420.

Figure 5:
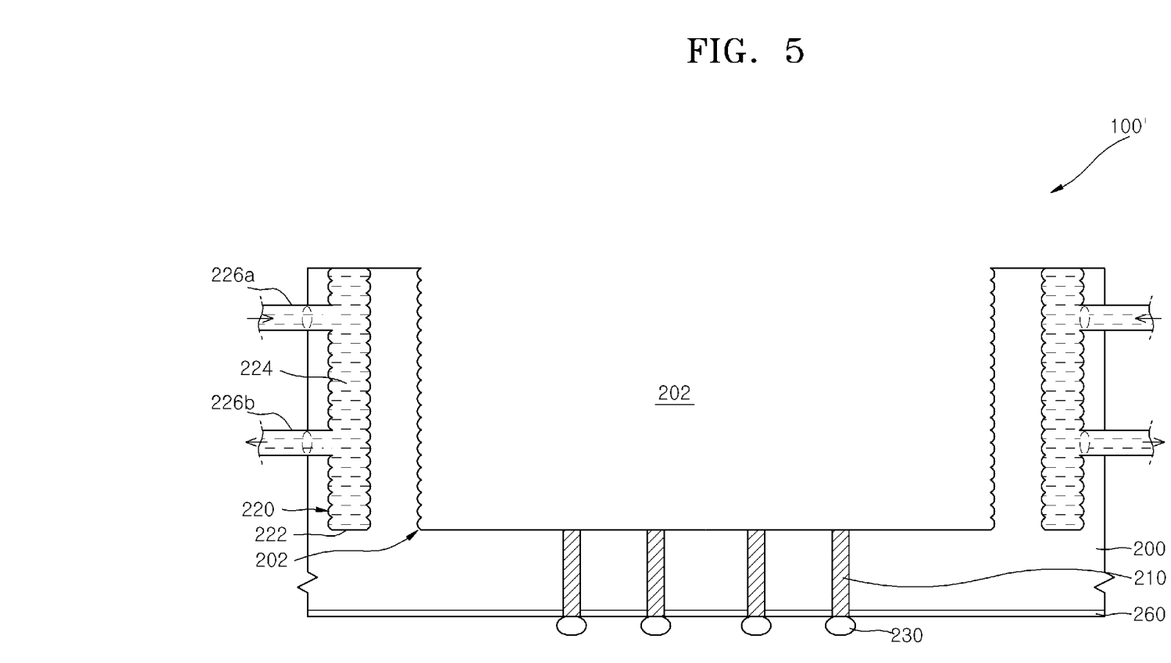
FIGS. 5, 6 and 7 are cross sectional views illustrating a method of fabricating a semiconductor device shown in FIG. 4.

FIGS. 5, 6 and 7 are cross sectional views illustrating a method of fabricating a semiconductor device shown in FIG. 4. Referring to FIG. 5, a chip carrier 100' may be provided. The chip carrier 100' may be formed to include a carrier body 200 having a cavity 202 therein and conductive through silicon vias (TSVs) 210 penetrating the carrier body 200 under the cavity 202. An upper portion of the cavity 202 may be open, and inner sidewall surfaces of the cavity 202 may have uneven surface profiles, for example, scallop profiles. This chip carrier 100' may have a similar structure to the chip carrier 100 described with reference to FIG. 1. A difference between the chip carrier 100' and the chip carrier 100 is that the chip carrier 100' does not include a lid (240 of FIG. 1) and a heat radiation plate (250 of FIG. 1) covering the cavity 202 at this stage. In FIGS. 1 and 5, the same reference numerals or the same reference designators denote the same elements. Thus, the chip carrier 100' may be formed using the same or similar ways as described with reference to FIGS. 2 and 3. However, as described above, the lid 240 and the heat radiation plate 250 may not be formed at this stage because a semiconductor chip module 300 should be put into the cavity 202 in a subsequent process.

Figure 6:
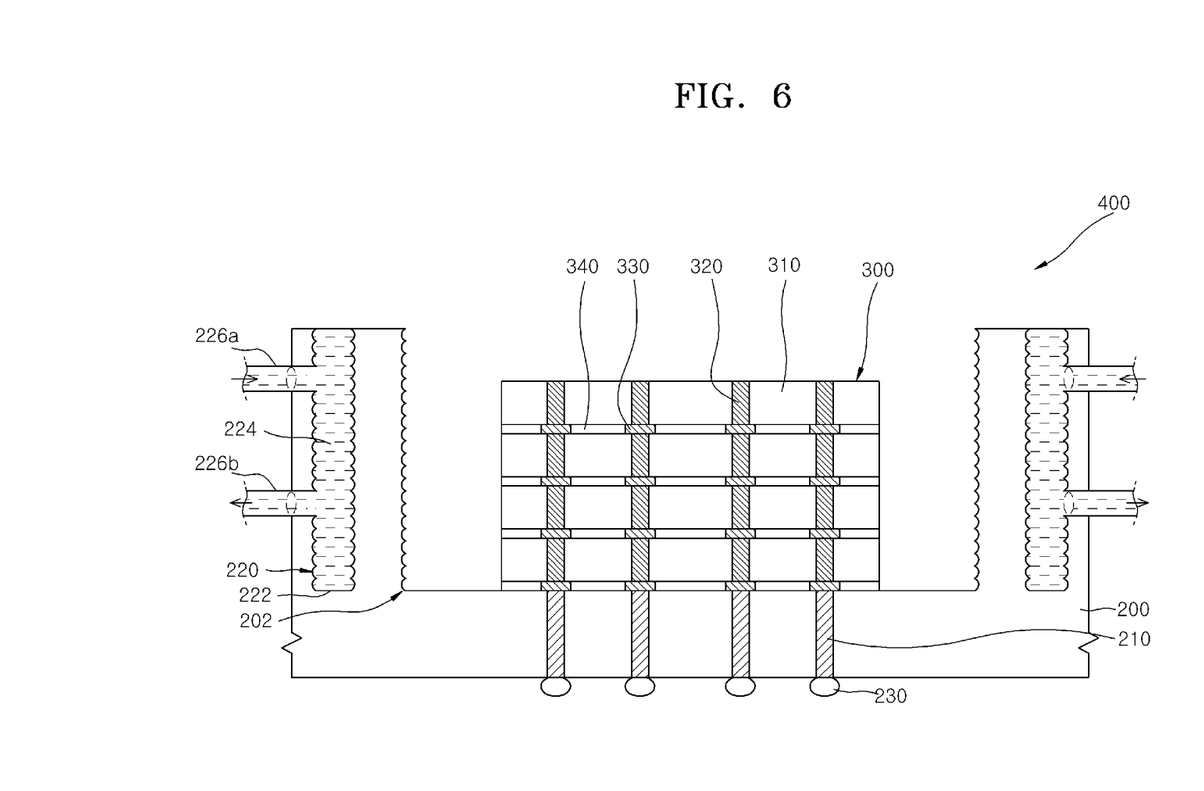

Referring to FIG. 6, after the chip carrier 100' is formed without the lid 240 and the heat radiation plate 250, the semiconductor chip module 300 may be mounted on a bottom surface of the cavity 202 of the chip carrier 100'. The semiconductor chip module 300 may include the plurality of semiconductor chips 310 vertically stacked. Each of the semiconductor chips 310 may include bumps 330 disposed on a bottom surface of a body thereof and through silicon vias (TSVs) 320 penetrating the body. In each semiconductor chip 310, the through silicon vias (TSVs) 320 may be connected to respective ones of the bumps 330. Thus, the through silicon vias (TSVs) 320 of the upper and lower semiconductor chips 310 may be electrically connected to each other by the bumps 330 between the upper and lower semiconductor chips 310. The lowermost semiconductor chip 310 among the plurality of semiconductor chips 310 may be aligned with the TSVs 210 penetrating the carrier body 200 under the cavity 202 such that the through silicon vias (TSVs) 320 of the lowermost semiconductor chip 310 may be electrically connected to the TSVs 210 through the bumps 330 between the lowermost semiconductor chip 310 and the carrier body 200. The semiconductor chip module 300 may have a width which is less than a width of the cavity 202 and a height which is less than a depth of the cavity 202.

Figure 7:
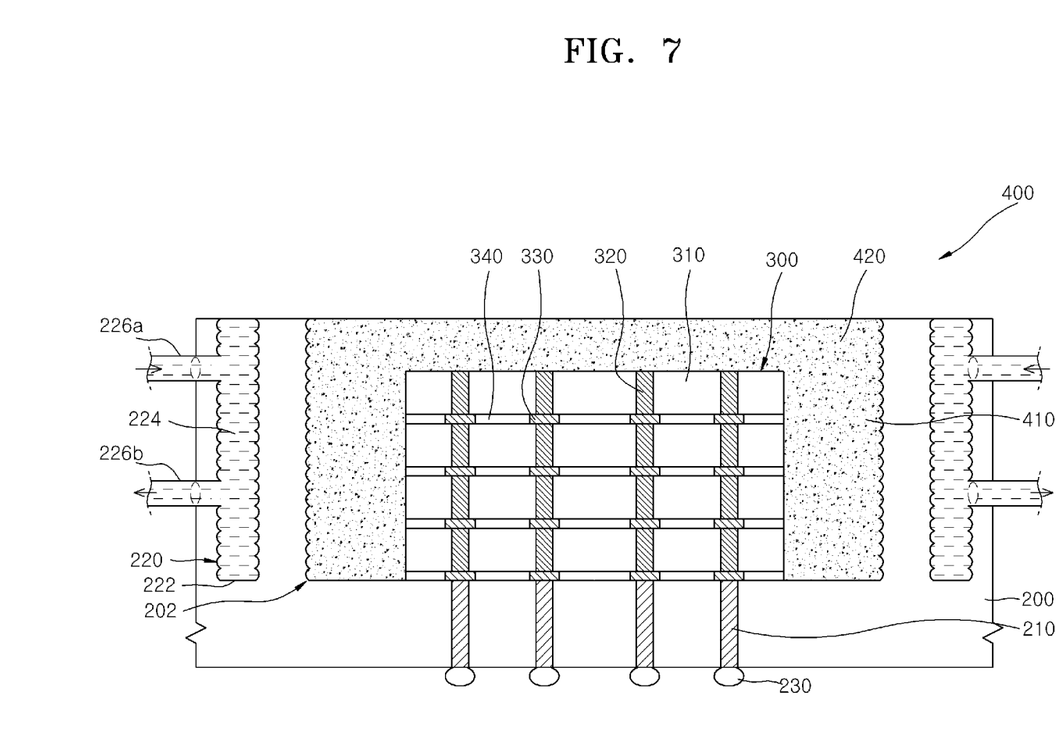

Referring to FIG. 7, an empty space between sidewall surfaces of the semiconductor chip module 300 and sidewall surfaces of the cavity 202 may be filled with a side thermal interface material (TIM) layer 410, and an empty space on a top surface of the semiconductor chip module 300 may be filled with an upper thermal interface material (TIM) layer 420. In an embodiment, the upper thermal interface material (TIM) layer 420 may be formed such that a top surface of the upper thermal interface material (TIM) layer 420 is coplanar with a top surface of the carrier body 200. Accordingly, the empty space on the sidewalls of the semiconductor chip module 300 may be filled with the side thermal interface material (TIM) layer 410, and the empty space on the top surface of the semiconductor chip module 300 may be filled with the upper thermal interface material (TIM) layer 420. The side thermal interface material (TIM) layer 410 and the upper thermal interface material (TIM) layer 420 may be formed of a material having a high thermal conductivity, for example, a polymer material or a metallic material.

If the side thermal interface material (TIM) layer 410 is formed of a metallic material, a thin insulation layer (not shown) may be formed between the semiconductor chip module 300 and the side thermal interface material (TIM) layer 410. Similarly, in the event that the upper thermal interface material (TIM) layer 420 is formed of a metallic material, a thin insulation layer (not shown) may also be formed between the semiconductor chip module 300 and the upper thermal interface material (TIM) layer 420. Subsequently, the lid 240 and the heat radiation plate 250 may be sequentially formed to cover the carrier body 200 and the upper portion of the cavity 202, such as, the upper thermal interface material (TIM) layer 420, as illustrated in FIG. 4.

Figure 8:
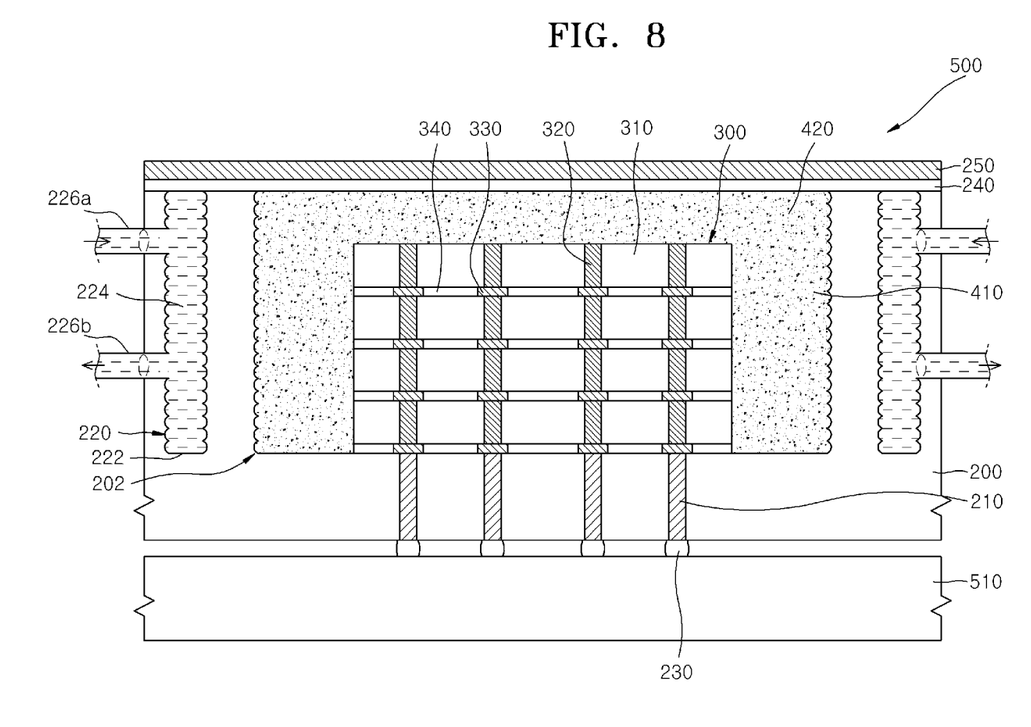
FIG. 8 is a cross sectional view illustrating a semiconductor package according to an embodiment.

FIG. 8 is a cross sectional view illustrating a semiconductor package according to an embodiment. Referring to FIG. 8, a semiconductor package 500 according to an embodiment may include the semiconductor device 400 of FIG. 4 and a substrate 510. The semiconductor device 400 may be mounted on the substrate 510. Specifically, a chip carrier having a cavity 202 may be mounted on the substrate 510, and a semiconductor chip module 300 may be mounted in the cavity 202. A structure including the chip carrier and the semiconductor chip module 300 in the chip carrier may have the same configuration as the semiconductor device 400 described with reference to FIG. 4. Thus, to avoid duplicate explanation, descriptions to the same components as illustrated in the semiconductor device 400 of FIG. 4 will be omitted or briefly mentioned hereinafter. Electrical connections between the substrate 510 and the chip carrier may be achieved by bumps 230 disposed therebetween. Alternatively, the electrical connections between the substrate 510 and the chip carrier may be achieved by connection members different from the bumps 230, for example, solder balls.

In some embodiments, the substrate 510 may be a printed circuit board (PCB). In some other embodiments, the substrate 510 may be a package substrate having a high reliable property, a high elastic modulus for thin packages, and/or a low coefficient of thermal expansion. The high reliable property may include a high insulating property and a thermal resistant property. In some other embodiments, the substrate 510 may be a flexible printed circuit board (FPCB) that is suitable for electronic products such as cellular phones, digital cameras or notebook computers. In some other embodiments, the substrate 510 may be a high performance heat radiation substrate that is suitable for realization of electronic devices employed in automobiles or light emitting diodes (LEDs). In any case, internal interconnections (not shown) may be disposed in the substrate 510. Electrical signal transmission between the semiconductor chip module 300 and an external device may be achieved by the internal interconnections disposed in the substrate 510.

In order to form the above semiconductor package 500, a carrier body 200 having a cavity 202 therein may be provided. The cavity 202 may be formed by etching a portion of a carrier body layer. The cavity 202 may be formed to include uneven vertical sidewall profiles, for example, scallop-shaped vertical sidewall profiles. Through silicon vias (TSVs) 210 may be formed to penetrate the carrier body 200 under the cavity 202. The TSVs 210 may be formed after formation of the cavity 202 or vice versa. The carrier body 200 having the cavity 202 and the TSVs 210 penetrating the carrier body 200 may constitute a chip carrier. A semiconductor chip module 300 may then be mounted on a bottom surface of the cavity 202. The chip carrier, on which the semiconductor chip module 300 is stacked, may be mounted on a substrate 510. Conductive members, for example, bumps 230 may be formed between the chip carrier and the substrate 510. The bumps 230 may be formed on the TSVs 210 that are exposed at a bottom surface of the carrier body 200 or on a top surface of the substrate 510. That is, the bumps 230 may be formed before the chip carrier is mounted on the substrate 510. Forming the chip carrier and mounting the semiconductor chip module 300 in the cavity 202 may be performed using the same processes as described with reference to FIGS. 5, 6 and 7.

Figure 9:
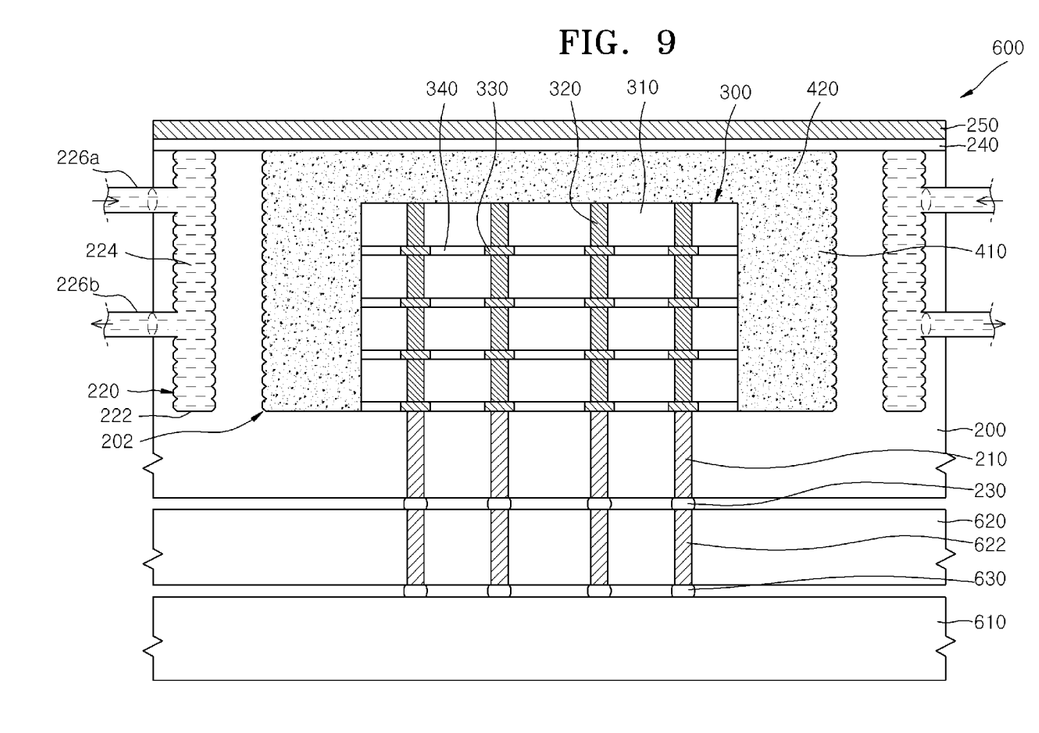
FIG. 9 is a cross sectional view illustrating a semiconductor package according to another embodiment.

FIG. 9 is a cross sectional view illustrating a semiconductor package according to another embodiment. Referring to FIG. 9, a semiconductor package 600 according to another embodiment may include a substrate 610, a first semiconductor chip module 620 disposed on the substrate 610, and a chip carrier disposed on the first semiconductor chip module 620. A second semiconductor chip module 300 may be mounted on a bottom surface of a cavity 202 in the chip carrier before the chip carrier is disposed on the first semiconductor chip module 620.

In some embodiments, the substrate 610 may be a printed circuit board (PCB). In some other embodiments, the substrate 610 may be a package substrate having a high reliable property, a high elastic modulus for thin packages, and/or a low coefficient of thermal expansion. The high reliable property may include a high insulating property and a thermal resistant property. In some other embodiments, the substrate 610 may be a flexible printed circuit board (FPCB) that is suitable for electronic products such as cellular phones, digital cameras or notebook computers. In some other embodiments, the substrate 610 may be a high performance heat radiation substrate that is suitable for realization of electronic devices employed in automobiles or light emitting diodes (LEDs). In any case, internal interconnections (not shown) may be disposed in the substrate 610.

A structure including the chip carrier and the second semiconductor chip module 300 in the chip carrier may have the same configuration as the semiconductor device 400 described with reference to FIG. 4. Thus, to avoid duplicate explanation, descriptions to the same components as illustrated in the semiconductor device 400 of FIG. 4 will be omitted or briefly mentioned hereinafter. In an embodiment, the semiconductor package 600 may be a system-in-package. That is, the first semiconductor chip module 620 may include at least one logic device, and the second semiconductor chip module 300 may include at least one memory device. The first semiconductor chip module 620 may be electrically connected to the substrate 610 through bumps 630 that are disposed between the first semiconductor chip module 620 and the substrate 610, and the TSVs 210 of the chip carrier may be electrically connected to the first semiconductor chip module 620 through the bumps 230 that are disposed between the first semiconductor chip module 620 and the chip carrier. However, the inventive concept is not limited thereto.

The bumps 230 on a top surface of the first semiconductor chip module 620 may be electrically connected to the bumps 630 on a bottom surface of the first semiconductor chip module 620 by the TSVs 622 penetrating a body of the first semiconductor chip module 620. Alternatively, the bumps 230 and the bumps 630 may be electrically connected to each other by interconnection lines which are different from the TSVs 622.

In order to form the above semiconductor package 600, a first semiconductor chip module 620 may be mounted on a substrate 610. A carrier body 200 having a cavity 202 therein may then be provided. The cavity 202 may be formed by etching a portion of a carrier body layer. The cavity 202 may be formed to include uneven vertical sidewall profiles, for example, scallop-shaped vertical sidewall profiles. Through silicon vias (TSVs) 210 may be formed to penetrate the carrier body 200 under the cavity 202. The TSVs 210 may be formed after formation of the cavity 202 or vice versa. The carrier body 200 having the cavity 202 and the TSVs 210 penetrating the carrier body 200 may constitute a chip carrier. Forming the chip carrier may be performed using the same procedures as described with reference to FIGS. 2 and 3. A second semiconductor chip module 300 may be then mounted on a bottom surface of the cavity 202. Disposing the second semiconductor chip module 300 in the cavity 202 may be performed using the same procedures as described with reference to FIG. 7. Subsequently, the chip carrier, in which the second semiconductor chip module 300 is disposed, may be mounted on a side of the first semiconductor chip module 620 that is opposite to the substrate.

Figure 10:
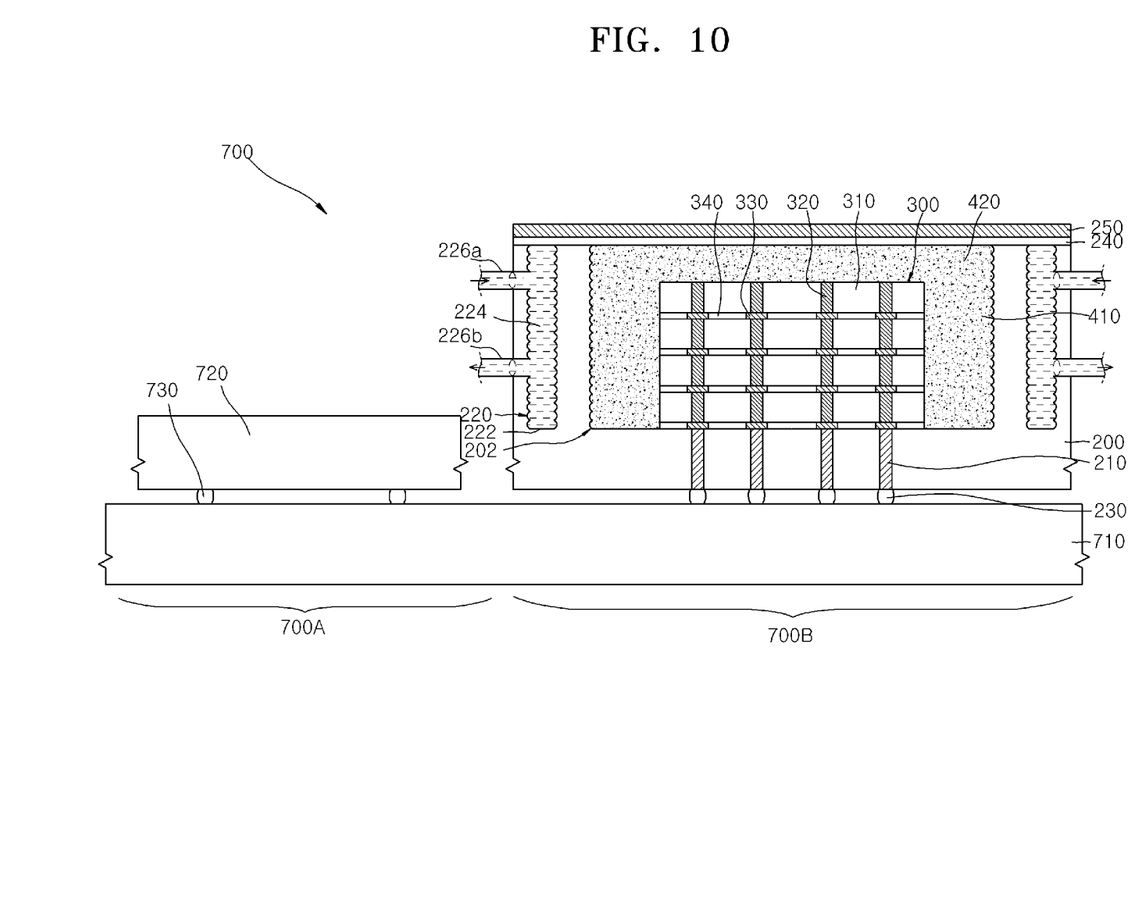
FIG. 10 is a cross sectional view illustrating a semiconductor package according to still another embodiment.

FIG. 10 is a cross sectional view illustrating a semiconductor package according to still another embodiment. Referring to FIG. 10, a semiconductor package 700 according to an embodiment may include a substrate 710 having a first region 700A and a second region 700B, a first semiconductor chip module 720 disposed on the first region 700A of the substrate 710, a chip carrier disposed on the second region 700B of the substrate 710, and a second semiconductor chip module 300 disposed in the chip carrier. The chip carrier may include a carrier body 200 having a cavity 202 therein and conductive through silicon vias (TSVs) 210 penetrating the carrier body 200 under the cavity 202. The cavity 202 may be formed by etching a portion of the carrier body 200. The cavity 202 may include sidewalls having uneven vertical surface profiles. For example, the cavity 202 may include scallop-shaped sidewall surface profiles. The second semiconductor chip module 300 may be mounted on a bottom surface of the cavity 202.

In some embodiments, the substrate 710 may be a printed circuit board (PCB). In some other embodiments, the substrate 710 may be a package substrate having a high reliable property, a high elastic modulus for thin packages, and/or a low coefficient of thermal expansion. The high reliable property may include a high insulating property and a thermal resistant property. In some other embodiments, the substrate 710 may be a flexible printed circuit board (FPCB) that is suitable for electronic products such as cellular phones, digital cameras or notebook computers. In some other embodiments, the substrate 710 may be a high performance heat radiation substrate that is suitable for realization of electronic devices employed in automobiles or light emitting diodes (LEDs). In any case, internal interconnections (not shown) may be disposed in the substrate 710.

A structure including the chip carrier and the second semiconductor chip module 300 in the chip carrier may have the same configuration as the semiconductor device 400 described with reference to FIG. 4. Thus, to avoid duplicate explanation, descriptions to the same components as illustrated in the previous embodiments will be omitted or briefly mentioned hereinafter. In an embodiment, the semiconductor package 700 may be a system-in-package. That is, the first semiconductor chip module 720 may include at least one logic device, and the second semiconductor chip module 300 may include at least one memory device. The first semiconductor chip module 720 may be electrically connected to the substrate 710 through bumps 730 between the first semiconductor chip module 720 and the substrate 710. Further, the TSVs 210 of the chip carrier may be electrically connected to the substrate 710 through bumps 230 between the substrate 710 and the chip carrier.

In order to form the above semiconductor package 700, the first semiconductor chip module 720 may be mounted on the first region 700A of a substrate 710. The carrier body 200 having a cavity 202 therein may be then provided. The cavity 202 may be formed by etching a portion of a carrier body layer. The cavity 202 may be formed to include uneven vertical sidewall profiles, for example, scallop-shaped vertical sidewall profiles. Through silicon vias (TSVs) 210 may be formed to penetrate the carrier body 200 under the cavity 202. The TSVs 210 may be formed after formation of the cavity 202 or vice versa. The carrier body 200 having the cavity 202 and the TSVs 210 penetrating the carrier body 200 may constitute a chip carrier. Forming the chip carrier may be performed using the same processes as described with reference to FIGS. 2 and 3. A second semiconductor chip module 300 may then be mounted on a bottom surface of the cavity 202. Disposing the second semiconductor chip module 300 in the cavity 202 may be performed using the same processes as described with reference to FIG. 7. Subsequently, the chip carrier, in which the second semiconductor chip module 300 is disposed, may be mounted on a second region 700B of the substrate 710.

According to the embodiments set forth above, a semiconductor chip module may be disposed in a cavity of a chip carrier, and the cavity may be formed to have uneven sidewall surface profiles. Thus, a sidewall surface area of the cavity may be increased to improve a heat emission efficiency of the chip carrier. Further, an empty space between the sidewalls of the cavity and the semiconductor chip module may be filled with thermal interface material (TIM) layers. Accordingly, heat generated from the semiconductor chip module may be more readily emitted toward an outside region of the chip carrier through the thermal interface material (TIM) layers.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A chip carrier comprising:
a carrier body having a cavity therein, the cavity including a scallop-shaped sidewall surface profile;
a heat sink disposed in sidewalls of the carrier body; and
at least one conductive through silicon via (TSV) penetrating the carrier body under the cavity,
wherein the at least one conductive through silicon via (TSV) is exposed at a bottom surface of the carrier body opposite to the cavity.

2. The chip carrier of claim 1, further comprising a lid covering an upper portion of the cavity.

3. The chip carrier of claim 2, wherein the lid includes the same material as the carrier body.

4. The chip carrier of claim 2, wherein the lid includes a metallic material.

5. The chip carrier of claim 2, further comprising a heat radiation plate on the lid opposite to the carrier body.

6. The chip carrier of claim 1, wherein the heat sink includes a heat sink hole having a scallop-shaped sidewall surface profile and a coolant filling the heat sink hole.

7. The chip carrier of claim 6, wherein the heat sink further includes first and second conduit lines extending from the heat sink hole, and the coolant in the heat sink hole circulates through the first and second conduit lines.

8. The chip carrier of claim 1, further comprising at least one electrode on the bottom surface of the carrier body,
wherein the at least one electrode is electrically connected to the at least one through silicon via (TSV).

9. The chip carrier of claim 8, wherein the at least one electrode is a pillar bump electrode, a solder bump electrode or an electrode pad.

10. A semiconductor device comprising:
a chip carrier including a carrier body having a cavity therein and at least one conductive through silicon via (TSV) penetrating the carrier body under the cavity, the cavity including a scallop-shaped sidewall surface profile;
a heat sink disposed in sidewalls of the carrier body; and
a semiconductor chip module disposed in the cavity,
wherein the at least one conductive through silicon via (TSV) is exposed at a bottom surface of the carrier body that is opposite to the cavity.

11. The semiconductor device of claim 10, further comprising a lid covering an upper portion of the cavity.

12. The semiconductor device of claim 11, further comprising an upper thermal interface material (TIM) layer between the lid and the semiconductor chip module.

13. The semiconductor device of claim 10, wherein the semiconductor chip module includes a plurality of semiconductor chips vertically stacked, and each of the semiconductor chips includes at least one through silicon via (TSV) penetrating a body thereof.

14. The semiconductor device of claim 10, further comprising a side thermal interface material (TIM) layer between sidewalls of the cavity and the semiconductor chip module.

15. A semiconductor package comprising:
a chip carrier including a carrier body having a cavity therein and at least one conductive through silicon via (TSV) penetrating the carrier body under the cavity, and the cavity including a scallop-shaped sidewall surface profile;
a heat sink disposed in sidewalls of the carrier body; and
a semiconductor chip module disposed in the cavity,
wherein the at least one conductive through silicon via (TSV) is exposed at a bottom surface of the carrier body opposite to the cavity.

16. The semiconductor package of claim 15, further comprising a lid covering an upper portion of the cavity.

17. The semiconductor package of claim 16, further comprising an upper thermal interface material (TIM) layer between the lid and the semiconductor chip module.

18. The semiconductor package of claim 15, wherein the semiconductor chip module includes a plurality of semiconductor chips vertically stacked, and each of the semiconductor chips includes at least one through silicon via (TSV) penetrating a body thereof.

19. The semiconductor package of claim 15, further comprising a side thermal interface material (TIM) layer between sidewalls of the cavity and the semiconductor chip module.

* * * * *